United States Patent
Krivokapic et al.

(10) Patent No.: US 6,320,236 B1
(45) Date of Patent: Nov. 20, 2001

(54) OPTIMIZATION OF LOGIC GATES WITH CRISS-CROSS IMPLANTS TO FORM ASYMMETRIC CHANNEL REGIONS

(75) Inventors: Zoran Krivokapic, Santa Clara; Ognjen Milic, Burlingame, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/413,737

(22) Filed: Oct. 6, 1999

(51) Int. Cl.$^7$ ............................................. H01L 29/76
(52) U.S. Cl. ................................. 257/402; 438/302
(58) Field of Search ............................... 257/402–404; 438/302, 525; 483/302

(56) References Cited

U.S. PATENT DOCUMENTS

| | | | |
|---|---|---|---|
| 5,589,701 | * 12/1996 | Baldi | 257/369 |
| 5,773,347 | * 6/1998 | Kimura et al. | 438/302 |
| 6,096,586 | * 8/2000 | Milic-Strkalj et al. | 438/174 |

OTHER PUBLICATIONS

Y Mii et al., High Performance 0.1micro meters nMOS-FET's with 10ps/stage Delay (85K) at 1.5V Power Supply.*

* cited by examiner

Primary Examiner—Stephen D. Meier
Assistant Examiner—C. Johnson

(74) Attorney, Agent, or Firm—LaRiviere, Grubman & Payne, LLP

(57) ABSTRACT

An integrated semiconductor logic gate apparatus having optimized asymmetric channel regions and method for fabricating the apparatus is disclosed. The fabrication process includes ion-implanting the drain side of the channel to produce asymmetric channels on the gate transistors by using a criss-cross form of ion implantation. The criss-cross ion-implantation is performed after formation of the multiple gate stacks and is facilitated by a patterned photoresist mask that leaves an open, unprotected region above adjacent gate stacks through which the ion-implantation is performed. The criss-cross ion-implantation includes two tilt angles that are determined by tangent expressions that factor the height of the photoresist mask, the width of the unprotected opening over pairs of gate stacks and the width of the channel regions, including a distance relating to the point where the source/drain potential barrier is a minimum beneath the overlying gate stack. Adjacent gate stacks can have asymmetric channels with the same dopant concentration, or may be fabricated having different concentrations by varying the height of the photoresist mask to achieve a wider ion-implantation beam and thus form a higher dopant concentration on the target channel region. The optimized gates with higher dopant concentration improves off-state leakage current ($10^{-8}$ amps/micron), but reduce the gate speed. The gates may also be optimized for gate speed and power consumption by producing uniformly doped asymmetric gates (20–50 pico-second fall time delays being achievable).

5 Claims, 4 Drawing Sheets

OPTIMIZATION OF LOGIC GATES WITH CRISS-CROSS IMPLANTS TO FORM ASYMMETRIC CHANNEL REGIONS

RELATED APPLICATION

This application is related to Ser. No. 08/986,086, filed Dec. 5, 1997, by the same inventors in an application entitled: OPTIMIZATION OF LOGIC GATES WITH CRISS-CROSS IMPLANTS TO FORM ASYMMETIC CHANNEL REGIONS, (As Amended and Allowed).

TECHNICAL FIELD

The present invention relates to integrated circuits and fabrication techniques for improving performance and power dissipation. More particularly, the present invention relates to integrated circuits and fabrication techniques that facilitate optimization of the design of unipolar circuit elements, such as FET and MOSFET semiconductors. Even more particularly, the present invention relates to integrated circuits and customized fabrication techniques that facilitate optimization of logic gates using unipolar circuit elements, such as FET and MOSFET semiconductors, by selectively producing asymmetric channel regions in the unipolar circuit elements.

BRIEF SUMMARY OF THE INVENTION

The trend in microelectronic circuitry is to implement new microprocessor logic circuitry which will have increased performance speed, higher density and increased functions with minimal power input. Traditionally the integrated circuit designer must trade-off between speed and power dissipation with the result that the integrated circuit design favors meeting the speed requirements by fabrication of integrated circuits having multiple logic gates rated for functioning at the higher speed without being able to control the power consumption. The type of design employed by the designer to produce the foregoing type of design is known as symmetrical design. FIGS. 1 and 2 depict the symmetrical design approach for manufacturing a MOS device having the source and drain regions doped symmetrically with concentrations of two dopant impurities D1 and D2. This approach to manufacturing MOS devices has limited applications and is considered adequate to channel lengths in the range of 0.25 μm.

As the miniaturization of MOS devices continues and the channel lengths become less than 0.25 μm, the need to customize devices also continues. As a solution, asymmetrical design approaches have been explored. The formation of individual asymmetric channel devices includes using an angled implant of an impurity on the source side of the channel of the device while masking the drain side so that a portion of the implant underlies the gate stack forming a more lightly doped region than the adjacent drain region. Exemplary is the above referenced pending application of one of the applicants of this invention, and the teachings of Odanaka et al., in a paper entitled "Potential Design and Transport Property of 0.1 μm MOSFET with Asymmetrical Channel Profile", IEEE Transactions on Electron Devices, Vol. 44, No. 4 (April 1997). Both of these exemplary approaches fail to address the method of producing customized MOS devices with less than 0.25 μm channel regions on multiple arrangement of MOS devices, such as in a logic gate. Pending application Ser. No. 08/909,044 teaches a particular approach for forming an asymmetrical MOS device on individual MOS devices by angularly implanting an impurity into the substrate at an angle ranging from 5 to 40 degrees. The Odanaka et al. paper teaches using Monte Carlo device simulation and process simulation to analyze device performance and transport property of 0.1 μm n-MOSFET with asymmetric channel profile.

The benefit of utilizing the asymmetric channel on individual MOS devices is seen to exist for use on multiple arrangements of MOS devices, such as on logic gates. The main benefit in such applications is being able to control roll-off of threshold voltages even though an asymmetric channel device has a channel length in the 0.1 μm range. Therefore, MOS devices can be densely packaged with the channel width Lg to be equal to the spacing Ls between MOS devices forming the logic gate, (ranging 50–200 nm), see generally FIG. 4. Additional benefits include being able to form MOS devices having extremely small junction capacitance, for example capacitances on the order of 50 fF (femtofarad), and a benefit of obtaining improved gate delays (20–50 pico-seconds for a 4-input Nand gate having a 50 fFload). Accordingly, a need is seen to exist for a method of optimizing the design of logic gate having multiple MOS devices by expanding upon the basic concept of producing asymmetric channel on single MOS devices. Thus, a primary object of the present invention is to provide a MOS semiconductor structure and process for producing logic gate integrated circuits having asymmetric channel design in each of the logic gate's MOS devices.

BRIEF SUMMARY OF THE INVENTION

Accordingly, the foregoing object is accomplished by providing an integrated semiconductor circuit fabrication method and device comprising at least two MOS transistors forming a logic gate optimized according to a desired device performance speed and packaging density by an asymmetric channel fabrication process. The asymmetric channel fabrication process comprises using a silicon substrate having at least two MOS transistors each having a source and drain region with a channel implant region on the drain side, below the surface of a gate structure, also referred to as a gate stack. The gate stack may comprise a silicon dioxide layer over the silicon substrate and a polysilicon layer over the silicon dioxide layer, or simply a polysilicon layer over the silicon substrate. Variations of either of the foregoing gate stack structures may include the formation of spacers about the gate stack. In one embodiment of the present invention, which is directed to channel implantation on adjacent, odd-even numbered MOS transistors in a logic gate arrangement, a criss-cross, two tilt-angle ion implantation approach is performed on the drain side of the respective channel regions between spaced apart photoresist masked portions of the logic gate. Aside from teaching asymmetric channel implantation on multiple MOS devices, the two tilt-angle ion implantation approach is different from prior methods of forming asymmetric channel designs in that the same photoresist pattern may be used for implanting adjacent MOS devices in the logic gate. Each tilt angle is different and is determined by respective formulas that factor the height of the photoresist mask over the gate stack, the width of the unprotected opening between gate stacks, and width of the gate stack Lg in accordance with the particular MOS device channel being implanted. If heavier doping is desired for a particular channel region, the height of the photoresist mask at that particular channel region may be varied to allow a greater concentration of dopant to reach the channel region. The drain-side of the channel is the preferred side to implant the channel dopant to increase the gate speed. By example, during asymmetric channel fabrication of a two MOS device logic gate fabricated to a stage where the photoresist mask has unprotected openings between gate stacks, a downward, right-to-left orientation of the ion beam would be employed to implant a drain-side of a channel region of the leftmost MOS device, while a downward, left-to-right implantation would be employed for the rightmost MOS device. Additionally, since the height of the photoresist is one variable for determining the tilt angle, photoresist patterns having different heights produce different concentration of channel dopant that impact the speed of the gate and the off-state leakage current. Further, the tilt angle implantation and photoresist masking may be employed on horizontal or vertical orientations of the substrate. Simulation results show that logic gates formed with asymmetric channel transistors having a gate spacing equal to twice the length of the channel length, (Ls=2Lg), yield a 45% improvement in gate delay over symmetric channel devices. Also, if the gate spacing is set to equal to the length of the channel length, (Ls=Lg), logic gates formed with asymmetric channel transistors yield a 230% improvement in gate delay compared to conventional device logic designs. If a photoresist pattern is formed having a large spacing between transistors, more channel dopant is implanted which results in improved off-state leakage. Further, and as another embodiment of the present invention, for channel lengths of less than 0.13 μm, the horizontal and vertical channel photoresist masking may be omitted due to the self-masking effect of the extremely small spacing between MOS devices.

BRIEF DESCRIPTION OF DRAWINGS

For fuller understanding of the present invention, reference is made to the accompanying drawing in the following Detailed Description of the Invention. In the drawings.

Figure 1:
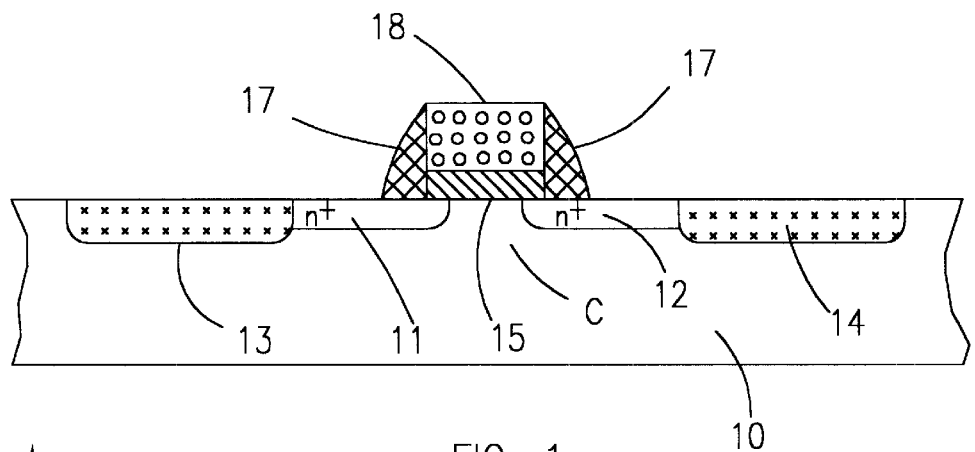
FIG. 1 is a cross-section of a prior art MOS device shown having a gate region fabricated with the source and drain regions symmetrically doped.

Reference numbers refer to the same or equivalent parts of the present invention throughout the several figures of the drawing.

DETAILED DESCRIPTION OF THE INVENTION

Figure 2:
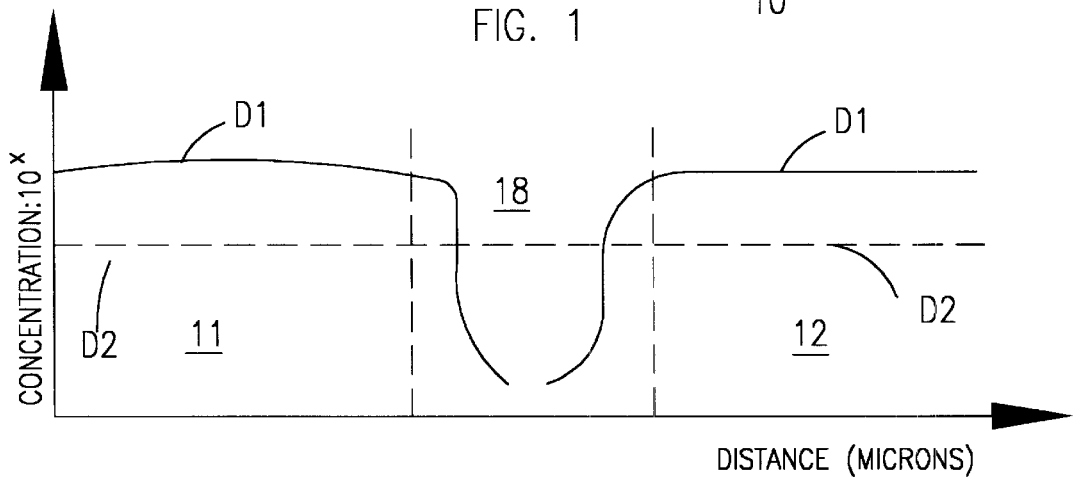
FIG. 2 is a dopant concentration plot showing uniform doping of a first dopant and a symmetrical doping of a second dopant that corresponds to the source and drain regions of the MOS device shown in FIG. 1.
Figure 3:
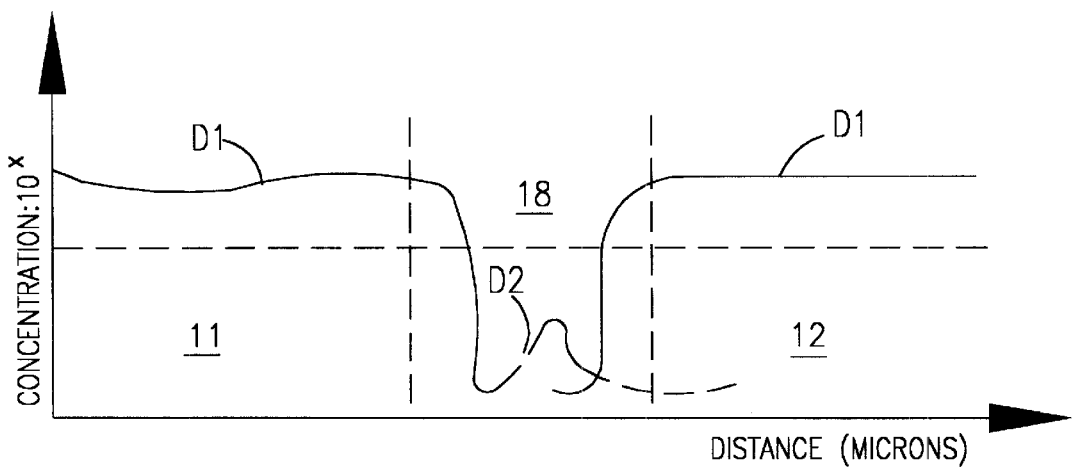
FIG. 3 is a dopant concentration plot showing asymmetrical doping of a MOS device in accordance with the objects of the present invention showing the drain region having a higher concentration of a second dopant.
Figure 4:
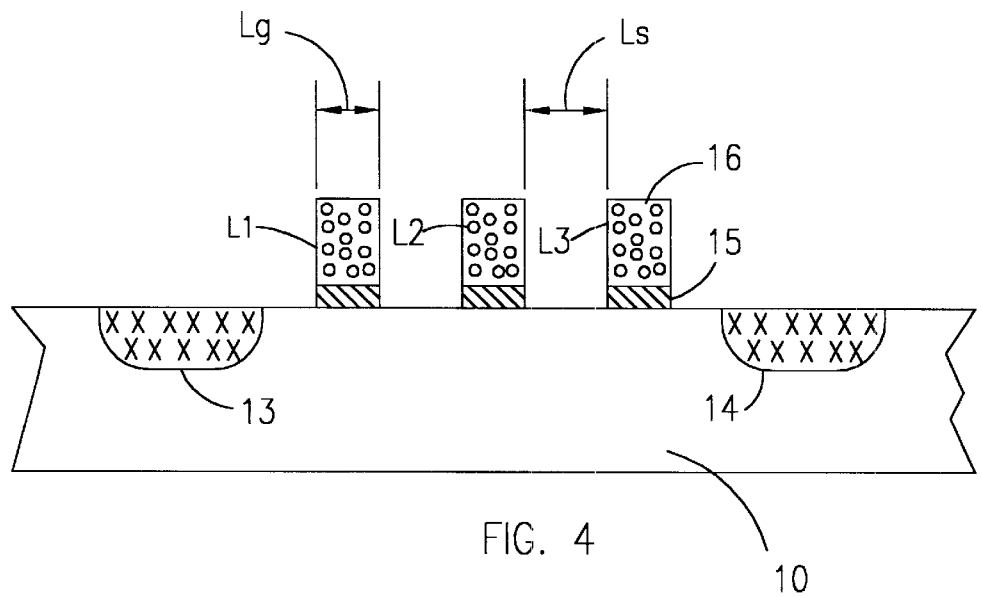
FIG. 4 is a cross-section of a three-gate prior art MOS device illustrating the width of the gate region and the spacing between gates which is greater than the gate width to assure fabrication of symmetrical gate regions.

FIGS. 1 and 2 depict the symmetrical channel design approach for manufacturing a MOS device having the source and drain regions doped symmetrically with equal concentrations of two dopant impurities DI and D2. This approach to manufacturing MOS devices has limited applications and is considered adequate to channel lengths in the range of 0.25 μm, or greater. Further, the symmetrical approach does not allow the transistor designers to customize channel doping at the source and drain regions differently in MOS logic gate devices. As depicted in FIG. 1, a single MOS device comprises a substrate 10, preferably a silicon semiconductor substrate having a pair of opposing, spaced apart isolation trench regions 13 and 14 fabricated within said semiconductor substrate. Each opposing trench region 13, 14 being fabricated from a dielectric insulating material and delineating a semiconducting region for forming a plurality of MOS device 18. By example, each MOS device 18 may comprise a polysilicon-oxide MOS gate structure having a channel region C between a source region 11, and a drain region 12. Polysilicon-oxide MOS gate structure comprises, by example, a silicon dioxide layer 15 formed over the surface of silicon substrate 10, a polysilicon layer 16 deposited over silicon dioxide layer 15 and a spacer region 17 formed about the gate stack's polysilicon-oxide layers 15, 16. In order to form a symmetrical channel as depicted in FIG. 1, the dopant concentration comprising source 11 and drain 12 regions is implanted having a concentration as depicted in FIG. 2. FIG. 2 shows a dopant concentration plot, expressed in $10^x$ atoms/cm$^3$ where 10 is raised to a power, of a first dopant D1 and a second dopant D2. D1 is symmetrically implanted about channel region C to a depth distance expressed in micron, while D2 is uniformly implanted across the channel. FIG. 3 is a dopant concentration plot showing asymmetrical doping of a MOS device, such as a MOS device 18 depicted in FIG. 1. In accordance with the objects of the present invention, and as shown in FIG. 3, the drain side 12 of channel C is formed having a higher concentration of dopant D2 than source side 11. FIG. 4 shows the dimensional relationship that limits being able to symmetrically dope a channel region in a MOS logic gate. As depicted, the logic gate shown in FIG. 4 comprises transistors L1, L2 and L3 having a polysilicon-oxide gate 15,16. The oxide layer 15 ranging in thickness from 1.50 nm to 3.0 nm and polysilicon layer 16 ranging in thickness from 15.0 nm to 20.0 nm. Each transistor has a channel width designated as Lg and the transistors are spaced apart by a distance Ls. Typically, the gate spacing Ls must be greater than the channel width Lg to facilitate gate elements being doped with symmetrical channel.

Figure 5:
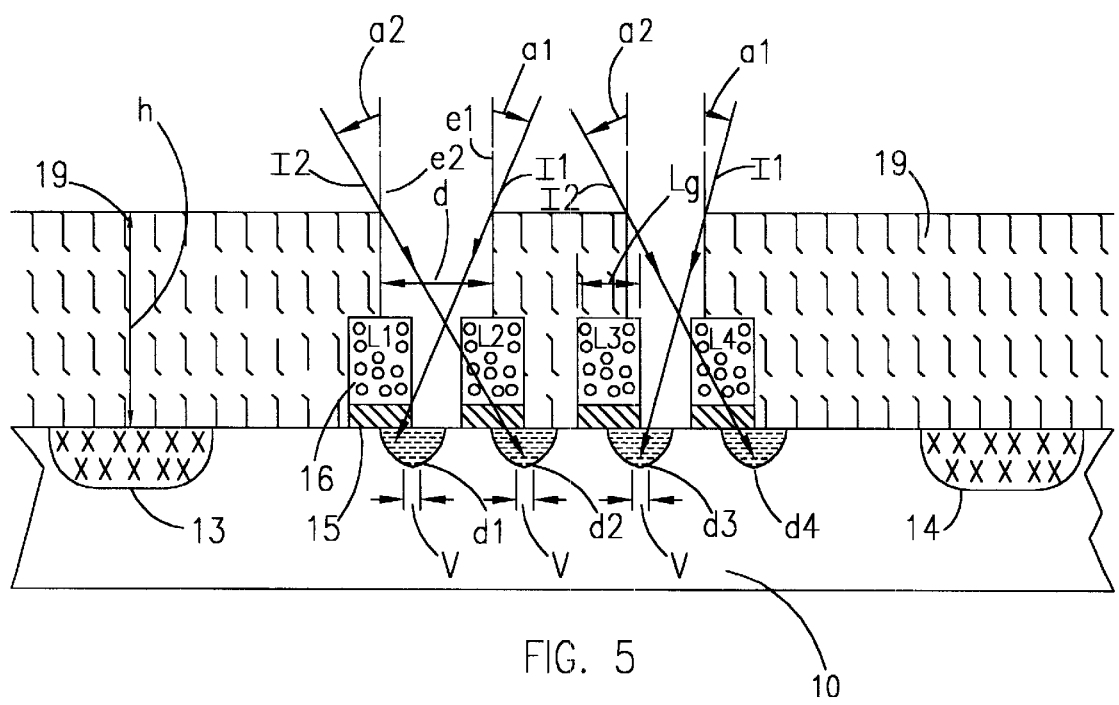
FIG. 5 is a cross-section of a four-gate MOS device showing a first embodiment for fabricating the MOS devices having an asymmetrical channel formed by implanting the drain side of the channel region in accordance with the present invention.

FIG. 5 shows a cross section of a 4-input logic gate semiconductor structure depicted having a uniform height h of horizontal channel photoresist mask 19 ranging in height from 0.60 μm to 1.2 μm and patterned such that odd/even transistor gate stack pairs L1/L2 and L3/L4 have an overhead unprotected region of width d and a channel width Lg. The unprotected region facilitates a criss-cross tilt angle implanting process to be performed to form an asymmetrical channel in accordance with the objects of the present invention. The criss-cross implanting process may also be performed on drain regions where the unprotected regions are overhead of the outer transistors of the logic gate stacks, see generally FIG. 6. In general, the pitch of the tilt angle implantation is determined by factoring the height h of the photoresist mask, the width of the unprotected region, the width of the gate stack Lg and a sub-micron distance variable value V in the range of 10–30 nm. This variable relates to the preferred placement of the peak channel dopant. The variable V is determinable as being the point where the source/drain potential barrier is a minimum, and is typically a distance on the drain side of the channel region, measured inward from a line extending from the edge of the overlying gate stack. More specifically, first and second implantation tilt angles a1 and a2, as depicted in FIG. 5, are measured relative to respective wall edges e1 and e2 of photoresist layer 19 delineating said unprotected openings and having angle magnitudes determined by a respective trigonometric equations:

$$\tan a1 = ((d-Lg/2)+V)/h$$

and $$\tan a2 = ((d+Lg/2)-V)/h.$$

By example, a first tilt angle implant I1 implanting boron on MOS devices L1 (L3) may be performed at an angle a1 ranging from 7° to 25°, at an energy ranging from 15 to 25 KeV, resulting in implanting boron at a concentration ranging from 1.0 to 2.5 $10^{13}$ atom/cm$^3$. A second tilt angle implant I2 implanting boron on MOS devices L2 (L4) may be performed at an angle a2 ranging from 7° to 35°, at an energy ranging from 70 to 100 KeV, implanting boron at a concentration ranging from 1.0 to 2.5 $10^{13}$ atom/cm$^3$ to obtain identical operating characteristics between logic gate inputs (L1, L3) and (L2,LA). The implanting effort of implant I1 being different from I2 due to the drain regions (d1,d3) being less obstructed than the drain regions being implanted by I2 which must penetrate the body of the polysilicon-oxide gate to reach the drain regions (d2,d4) of the channel. In accordance with the present invention, MOS devices can be densely packaged with the channel width Lg to be equal to the spacing Ls between MOS devices forming the logic gate, (ranging 50–200 nm), see generally FIG. 4. Additional benefits include being able to form MOS devices having extremely small junction capacitance, for example capacitances on the order of 50 fF (femtofarad), with the benefit of obtaining improved gate delays (20–50 pico-seconds for a 4-input Nand gate having a 50 fF load).

Figure 6:
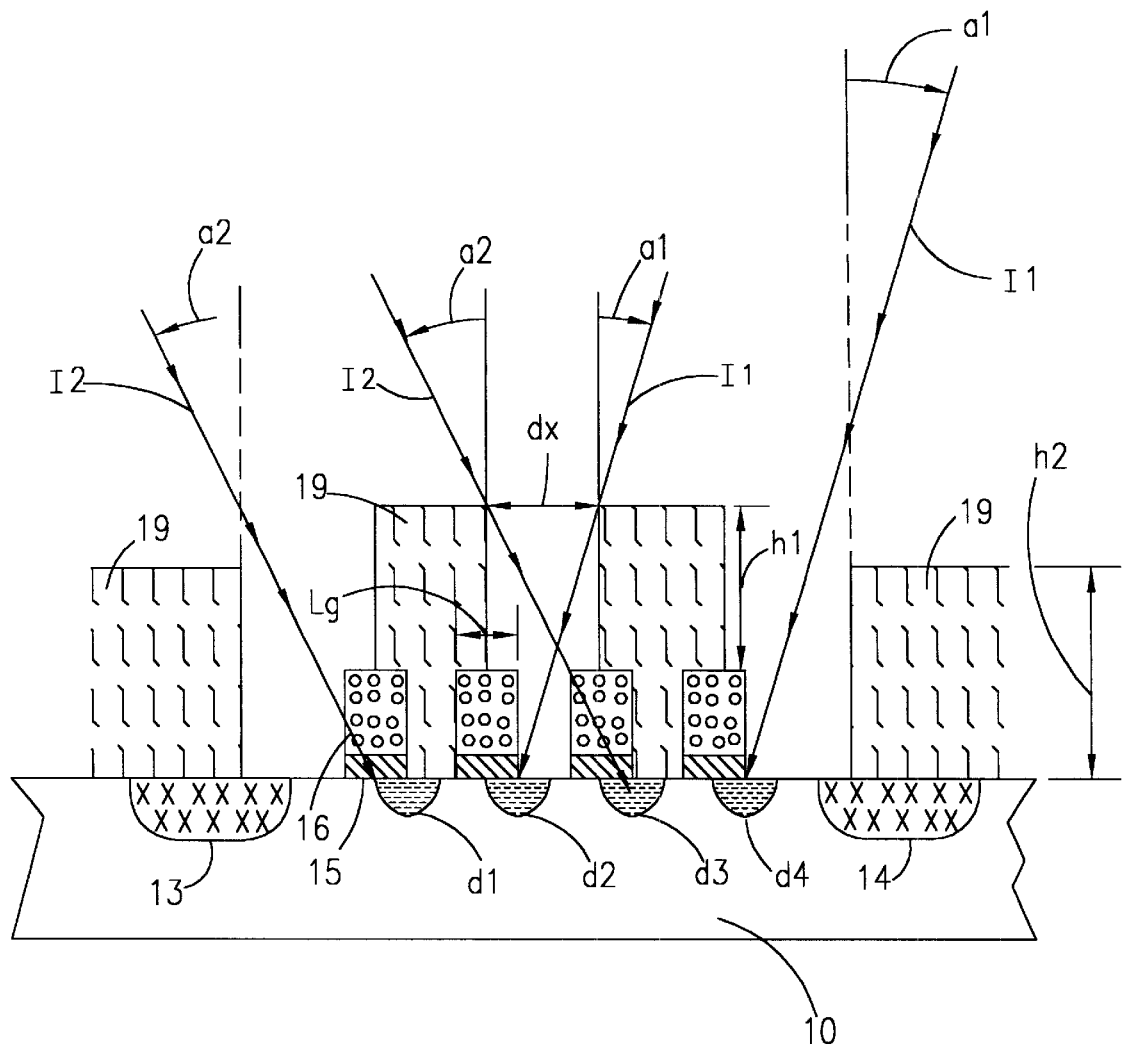
FIG. 6 is a cross-section of a four-gate MOS device showing an alternative embodiment for fabricating the MOS devices having selected asymmetrical channel formed with a higher concentration by varying the height of the photoresist masking in accordance with the present invention.

FIG. 6 shows a criss-cross method of implanting a 4-input logic gate semiconductor structure. The object underlying FIG. 6 being to provide higher dopant concentration for drain regions d1 and d4 than for drain regions d2 and d3. Although the implant operations I1,I2 are performed at their respective angles a1, a2 for both drain regions (d2,d3) and (d1,d4), the resulting dopant concentration is higher for drain regions d1, d4 due to the difference in photoresist height h1 versus h2. Height h2 is purposely less to facilitate implant operations I1 and I2 to be less obstructed by photoresist 19 during implanting of regions d2 and d4. The height h1 is the quantity used to determine the tilt angles a1, a2. The 4-input gates resulting from this type of combination implant, while compromising gate speed, there is a benefit of obtaining a better off-state leakage current control, typically below $10^{-8}$ amps per micron.

Figure 7:
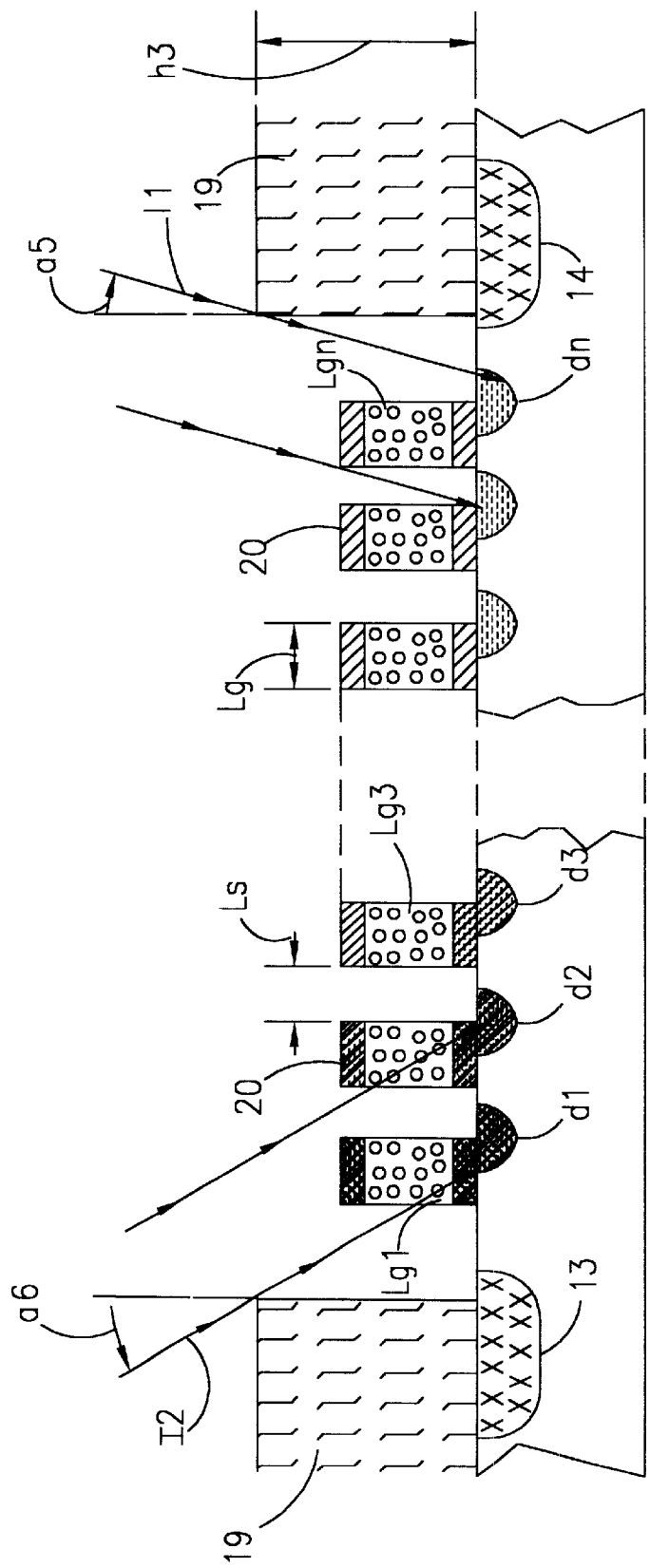
FIG. 7 is a cross-section of a multiple-gate (n-gate), sub-0.13 μm MOS device showing an alternative embodiment for fabricating asymmetric channel MOS logic gate device without photoresist masking, in accordance with the present invention.

FIG. 7 is a cross-section of a multiple input-gate (n-input gate), shown with Lg and Ls in sub-0.13 μm range for the multiple MOS devices. In this embodiment of the invention for fabricating asymmetric channel MOS logic gate devices, the photoresist masking is omitted from the logic gate MOS devices due to the self-masking characteristic of the sub-0.13 μm dimensions associated with structure. As depicted in FIG. 7, and in the interest of obtaining high gate speeds, the drain side of the channel is preferably implanted. The user has at least three implanting options, namely the single tilt angle implants either I1, or I2, and the criss-cross implanting option involving both I1 and I2 implant operations. In utilizing non-photoresist masking of the MOS devices, an anti-reflective layer 20, comprising oxynitride, is deposited over the polysilicon-oxide gate structure. The implant angles a1, a2 are determined using the height h3 of the photoresist over isolation trenches 13 and 14. The user of this method may increase Ls, resulting in sacrificing gate speed while gaining improved off-state leakage currents.

The present invention has been particularly shown and described with respect to a certain preferred embodiment and features thereof. However, it should be readily apparent to those of ordinary skill in the art that various changes and modifications in form, semiconductor material, material conductivity type, and detail may be made without departing from the spirit and scope of the inventions as set forth in the appended claims. The inventions illustratively disclosed herein may be practiced without any element which is not specifically disclosed herein.

What is claimed is:

1. A logic gate semiconductor apparatus, said apparatus comprising:

a silicon semiconductor substrate member;

at least one pair of opposing, spaced apart isolation trench regions fabricated on said semiconductor substrate member; and a logic gate comprising of at least two, spaced apart transistors disposed between said trench regions, each said transistor being fabricated as a MOS semiconducting device, said MOS semiconducting device comprising a polysilicon-oxide MOS gate structure having a channel region, a source region, and a drain region fabricated beneath said polysilicon-oxide MOS gate structure, each said polysilicon-oxide MOS gate structure being spaced apart from an adjacent polysilicon-oxide MOS gate structure by a distance Ls, each said transistor having an optimized asymmetric channel region whose impurity profile comprises a higher dopant concentration on a drain side than on a source side, said dopant concentration being optimally implanted according to said transistor's functional characteristic in said logic gate, said dopant concentration being implanted at a fabrication implanting step utilizing a criss-cross form of implanting technique, wherein, said MOS gate structure comprises a channel length in a range of 50–200 nm; and having said dopant concentration optimized to achieve a gate delay time in the range of 20–50 pico-seconds for a 4 input Nand gate device having a load of 50 fF, and wherein said dopant concentration comprises boron implanted at a first tilt angle a1 ranging from 7° to 25° in magnitude, said boron being implanted at an implant energy ranging from 15 to 25 KeV, and at a first concentration level ranging from 1.0 to 2.5 $10^{13}$ atom/cm$^3$; and wherein said dopant concentration also comprises boron implanted at a second tilt angle a2 ranging from 7° to 35° in magnitude, said boron implanted at said second tilt angle being implanted at an implant energy ranging from 70 to 100 KeV, and at a second concentration level ranging from 1.0 to 2.5 $10^{13}$ atom/cm$^3$ to obtain identical operating characteristics between logic gate inputs.

2. A logic gate semiconductor apparatus, said apparatus comprising:

a silicon semiconductor substrate m ember;

at least one pair of opposing, spaced apart isolation trench regions fabricated on said semiconductor substrate member; and a logic gate comprising of at least two, spaced apart transistors disposed between said trench regions, each said transistor being fabricated as a MOS semiconducting device, said MOS semiconducting device comprising a polysilicon-oxide MOS gate structure having a channel region, a source region, and a drain region fabricated beneath said polysilicon-oxide MOS gate structure, each said polysilicon-oxide MOS gate structure being spaced apart from an adjacent polysilicon-oxide MOS gate structure by a distance Ls, said channel region having a length measuring in a range of 20–200 nm, each said transistor having an optimized asymmetric channel region whose impurity profile comprises a higher dopant concentration on a drain side than on a source side, said dopant concentration being implanted at a fabrication implanting step utilizing a criss-cross form of implanting technique, said dopant concentration being optimumly implanted to achieve a gate delay time of 20–50 pico-seconds, wherein said dopant concentration comprises a dopant impurity implanted at a first tilt angle a1 ranging from 7° to 25° in magnitude, said dopant impurity being implanted at an implant energy ranging from 15 to 25 KeV, and at a first concentration level ranging from 1.0 to 2.5 $10^{13}$ atom/cm³; and wherein said dopant concentration also comprises said dopant impurity implanted at a second tilt angle a2 ranging from 7° to 35° in magnitude, said dopant impurity implanted at said second tilt angle being implanted at an implant energy ranging from 70 to 100 KeV, and at a second concentration level ranging from 1.0 to 2.5 $10^{13}$ atom/cm³ to obtain identical operating characteristics between logic gate inputs.

3. A logic gate semiconductor apparatus as described in claim 2, wherein:

said dopant impurity comprises boron.

4. A logic gate semiconductor apparatus, said apparatus comprising:

a silicon semiconductor substrate member;

at least one pair of opposing, spaced apart isolation trench regions fabricated on said semiconductor substrate member; and a logic gate comprising of at least two, spaced apart transistors disposed between said trench regions, each said transistor being fabricated as a MOS semiconducting device, said MOS semiconducting device comprising a polysilicon-oxide MOS gate structure having a channel region, a source region, and a drain region fabricated beneath said polysilicon-oxide MOS gate structure, each said polysilicon-oxide MOS gate structure being spaced apart from an adjacent polysilicon-oxide MOS gate structure by a distance Ls, each said transistor having an optimized asymmetric channel region whose impurity profile comprises a higher dopant concentration on a drain side than on a source side, said dopant concentration being optimally implanted according to said transistor's functional characteristic in said logic gate, wherein, said MOS gate structure comprises a channel region length in a range of 50–200 nm and said dopant concentration being optimized to achieve off-state leakage current in the $10^{-8}$ amps per micron range, wherein said dopant concentration comprises a dopant impurity implanted at a first tilt angle a1 ranging from 7° to 25° in magnitude, said dopant impurity being implanted at an implant energy ranging from 15 to 25 KeV, and at a first concentration level ranging from 1.0 to 2.5 $10^{13}$ atom/cm³; and wherein said dopant concentration also comprises said dopant impurity implanted at a second tilt angle a2 ranging from 7° to 35° in magnitude, said dopant impurity implanted at said second tilt angle being implanted at an implant energy ranging from 70 to 100 KeV, and at a second concentration level ranging from 1.0 to 2.5 $10^{13}$ atom/cm³ to obtain identical operating characteristics between logic gate inputs.

5. A logic gate semiconductor apparatus as described in claim 4, wherein:

said dopant impurity comprises boron.

* * * * *

UNITED STATES PATENT AND TRADEMARK OFFICE
CERTIFICATE OF CORRECTION

PATENT NO.   : 6,320,236 B1
DATED        : November 20, 2001
INVENTOR(S)  : Zoran Krivokapic and Ognjen Milic It is certified that error appears in the above-identified patent and that said Letters Patent is hereby corrected as shown below:

Column 4,
Line 6, after the word "impurities" delete "DI" and replace with -- D1 --;

Column 5,
Line 29, delete "(L2, LA).]" and replace with -- (L2, L4). --;

Column 7,
Line 1, delete "m ember;" and replace with -- member; --.

Signed and Sealed this

Ninth Day of July, 2002

Attest:

Attesting Officer

JAMES E. ROGAN
Director of the United States Patent and Trademark Office